United States Patent
Bijvoet

(10) Patent No.: US 8,345,265 B2
(45) Date of Patent: Jan. 1, 2013

(54) LITHOGRAPHIC APPARATUS AND METHODS FOR COMPENSATING SUBSTRATE UNFLATNESS, DETERMINING THE EFFECT OF PATTERNING DEVICE UNFLATNESS, AND DETERMINING THE EFFECT OF THERMAL LOADS ON A PATTERNING DEVICE

(75) Inventor: Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 438 days.

(21) Appl. No.: 12/616,185

(22) Filed: Nov. 11, 2009

(65) Prior Publication Data

US 2010/0129741 A1 May 27, 2010

Related U.S. Application Data

(60) Provisional application No. 61/116,997, filed on Nov. 21, 2008.

(51) Int. Cl.
*G01B 11/24* (2006.01)

(52) U.S. Cl. ............. 356/601; 355/30; 355/66; 355/53; 356/237.5; 356/237.1; 356/399

(58) Field of Classification Search .............. 355/30, 355/72–77, 66, 67, 52–53; 356/399, 623, 356/237.1–237.5

See application file for complete search history.

(56) References Cited

U.S. PATENT DOCUMENTS

| 6,262,792 B1 * | 7/2001 | Higashiki ............ 356/399 |
| 6,842,247 B1 | 1/2005 | Wehrens et al. |
| 6,897,940 B2 * | 5/2005 | Sogard ............... 355/75 |
| 7,187,432 B2 | 3/2007 | Matsui |
| 7,498,596 B2 | 3/2009 | Maeda |
| 8,159,647 B2 * | 4/2012 | Bleeker et al. ........ 355/52 |
| 2008/0013068 A1 | 1/2008 | Jeunink et al. |

FOREIGN PATENT DOCUMENTS

| JP | 09-180989 | 7/1997 |
| JP | 09-283436 | 10/1997 |
| JP | 2000-232061 | 8/2000 |
| JP | 2005-101615 | 4/2005 |
| JP | 2005-150527 | 6/2005 |
| JP | 2005-209896 | 8/2005 |
| JP | 2006-339438 | 12/2006 |
| JP | 2007-095767 | 4/2007 |
| JP | 2008-066543 | 3/2008 |

OTHER PUBLICATIONS

Japanese Office Action mailed Oct. 13, 2011 in corresponding Japanese Patent Application No. 2009-258575.

* cited by examiner

*Primary Examiner* — Gregory J Toatley
*Assistant Examiner* — Iyabo S. Alli
(74) *Attorney, Agent, or Firm* — Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a sensor configured to measure a height level, curvature and/or angle of a surface of a patterning device supported on the support.

15 Claims, 3 Drawing Sheets

LITHOGRAPHIC APPARATUS AND METHODS FOR COMPENSATING SUBSTRATE UNFLATNESS, DETERMINING THE EFFECT OF PATTERNING DEVICE UNFLATNESS, AND DETERMINING THE EFFECT OF THERMAL LOADS ON A PATTERNING DEVICE

CROSS REFERENCE TO RELATED APPLICATIONS

This application claims priority and benefit under 35 U.S.C. §119(e) to U.S. Provisional Patent Application No. 61/116,997, entitled "Lithographic Apparatus and Methods For Compensating Substrate Unflatness, Determining The Effect Of Patterning Device Unflatness, and Determining The Effect Of Thermal Loads On A Patterning Device", filed on Nov. 21, 2008. The content of that application is incorporated herein in its entirety by reference.

FIELD

The present invention relates to a lithographic apparatus, a method for compensating substrate unflatness, a method for determining the effect of patterning device unflatness, and a method for determining the effect of thermal loads on a patterning device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The surface of a substrate or patterning device may not be perfectly flat. This unflatness of a substrate or patterning device may have a substantial influence on the imaging accuracy of a lithographic process. In order to take into account the unflatness of a substrate it has been proposed to measure a height map of the substrate before the lithographic process. In a scanning type lithographic, this height map may be used during the lithographic process to correct for height differences in the surface of the substrate by continuous adaptation of the position of the substrate support.

In this method, which is also referred to as leveling, for each location of the projection slit, i.e. the area in which the (patterned) beam is radiated, with respect to the substrate an optimal height and orientation of the substrate may be realized. However, it is not possible to make any corrections for differences in height within the area of a projection slit. Since for each projection slit only one position, i.e. height and orientation, of the substrate with respect to the projection beam may be used.

It has been proposed to use a patterning device bending device to influence the curvature of a patterning device. Such patterning device bending device may be used for optimization of the patterned projection beam within the projection slit area. With such patterning device bending device, the curvature of the patterning device may be adapted to the curvature of the substrate, in particular the area of the substrate on which a patterned radiation beam is projected. A patterning device bending device is disclosed in US 2008-0013068, the contents of which is herein in its entirety incorporated by reference.

SUMMARY

It is desirable to provide a lithographic apparatus in which the imaging errors, such as focus or overlay errors may be decreased.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a sensor configured to measure a height level, or a curvature, or an angle, or any combination of the foregoing, of a surface of a patterning device supported on the support.

According to an embodiment of the invention, there is provided a method for compensating substrate unflatness in a lithographic process, the lithographic process including forming a patterned radiation beam using a patterning device which is configured to impart a radiation beam with a pattern in its cross-section, and projecting the patterned beam of radiation onto the substrate, the method including: measuring the substrate unflatness; determining a desired curvature for the patterning device to compensate for the substrate unflatness; measuring a curvature of the patterning device; comparing the measured curvature and the desired curvature; and controlling a patterning device bender configured to bend the patterning device based on the comparing to compensate the patterning device unflatness.

According to an embodiment of the invention, there is provided a method for determining the effect of patterning device unflatness in a lithographic process, the lithographic process including forming a patterned radiation beam using a patterning device which is configured to impart a radiation beam with a pattern in its cross-section, and projecting the patterned beam of radiation onto the substrate, the method including: measuring a patterning device unflatness during the lithographic process; determining an imaging error, such as focal errors, in the lithographic process; and analyzing the relation between the focal errors and the patterning device unflatness.

According to an embodiment of the invention, there is provided a method for determining the effect of thermal loads on a patterning device during a lithographic process, the lithographic process including forming a patterned radiation beam using a patterning device which is configured to impart a radiation beam with a pattern in its cross-section, and projecting the patterned beam of radiation onto the substrate, the method including: measuring a patterning device unflatness during the lithographic process; and determining a change of the patterning device unflatness in the course of time.

According to an aspect of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a sensor configured to measure a surface characteristic of the patterning device supported on the support; and a bender configured to bend the patterning device based on the surface characteristic measured by the sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
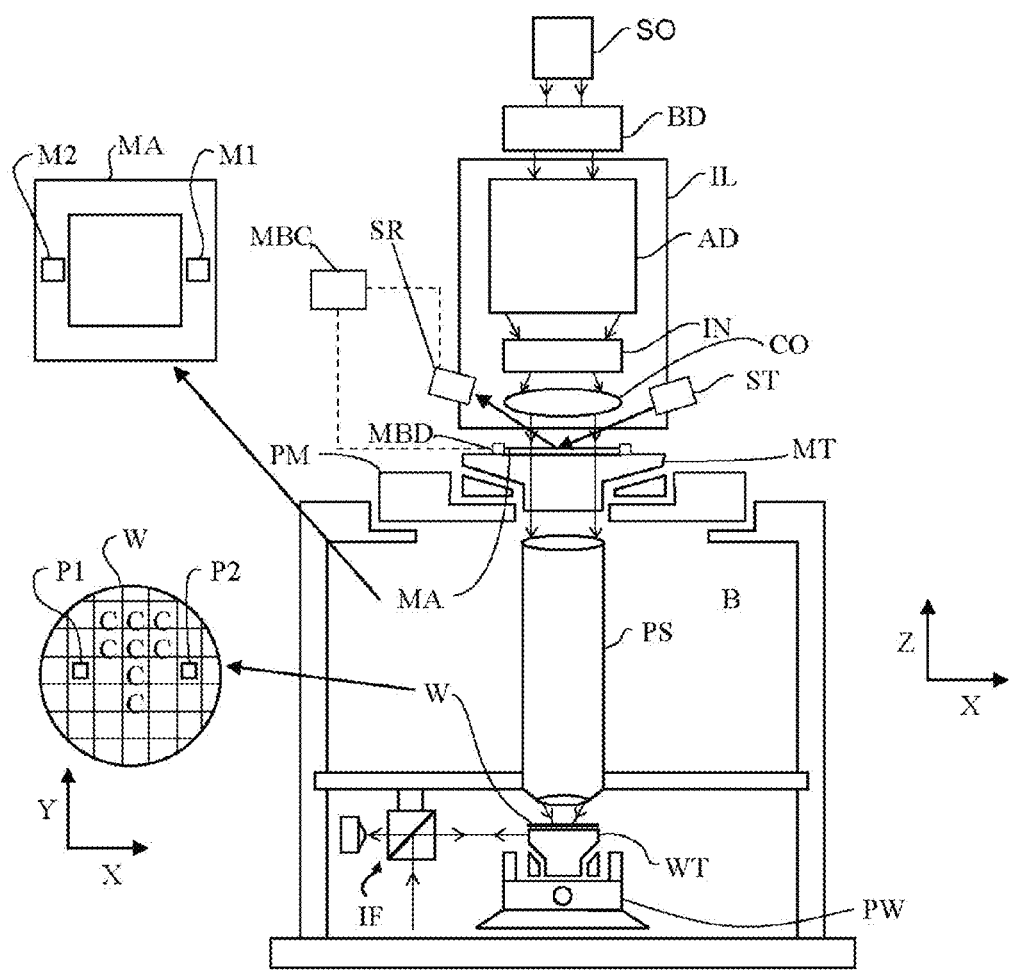
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The surface of a substrate W or patterning device MA may not be perfectly flat. This unflatness of a substrate W and/or patterning device MA may have a substantial influence on the imaging accuracy of a lithographic process. In order to take into account the unflatness of a substrate W a height map of the substrate W may be made before the lithographic process. In the scanning-type lithographic apparatus of FIG. 1, this height map may be used during the lithographic process to correct for height differences in the surface of the substrate W by continuous correction of the position and/or the orientation of the substrate table WT by actuating the second positioner PW on the basis of the height map information of the substrate W. In this way for each position of the substrate with respect to the projection system, an optimal position and orientation of the substrate W with respect to the projection system PS may be obtained.

This method, which is also referred to as leveling, improves the imaging quality of the lithographic apparatus. However, with this method it may not be possible to correct for the unflatness within the projection area, i.e. the area which is projected at one time by a patterned radiation beam. This area is defined by a projection slit (see FIG. 3) in the lithographic apparatus. During the lithographic process, the patterned beam is scanned over the patterning device MA and the substrate W, therewith moving the projection area along the surface of the substrate W.

In order to further increase the imaging quality of the lithographic apparatus of FIG. 1, the lithographic apparatus is provided with a patterning device bending device MBD (also termed hereinafter patterning device bender) configured to bend the patterning device MA to a desired curvature. With this patterning device bending device MBD it is possible to bend the patterning device MA, at least in the projection area, to a curvature which corresponds at least partially to the curvature of the substrate W within the projection area. For instance, when within a projection area of the substrate W the substrate has a parabolic surface, the patterning device MA may be bended to have a corresponding parabolic shape. The patterning device bender MBD may be designed to realize a desired curvature in one or more directions. Preferably, a desired curvature in at least a direction perpendicular to the scanning direction may be realized An embodiment of a patterning device bending device is disclosed in US 2008-0013068, the contents of which is herein incorporated in its entirety by reference.

During the scanning movement, the curvature of the patterning device MA may continuously be adapted to the curvature of the substrate W to increase the image quality.

The patterning device bender MBD is controlled by a patterning device bending controller MBC. The patterning device bending controller MBC is at least provided with a preferred curvature of the patterning device MA at the location of the projection area. This preferred curvature may be provided by another device, for instance a main controller, or may be calculated by the patterning device bending controller MDC on the basis of the height level map of the substrate W. Also, the patterning device bending controller MBC may be part of a main controller of the lithographic apparatus. The controller may include a subtractor to calculate the difference between the measured curvature and the desired curvature of the patterning device.

In the lithographic apparatus, a sensor is provided which is designed to determine the curvature of the patterning device MA. The sensor includes a sensor transmitter ST and sensor receiver SR. The sensor transmitter ST is configured to transmit a measurement beam toward the upper surface of the patterning device MA. The sensor receiver SR is configured to receive the measurement beam after reflection on the surface of the patterning device MA. Using this sensor device, a curvature or height map of the patterning device MA supported on the patterning device support (e.g. mask table) MT can be made. A benefit of this sensor is it makes it possible to determine a curvature and/or height map of the patterning device during the actual lithographic process.

Generally, the measurements of the sensor may for example be used to determine the unflatness of the patterning device. This information may be used to analyze the effect of patterning device unflatness on the imaging quality. Also, the sensor could be used to measure a change in the surface of the patterning device over time, for instance due to temperature differences in the patterning device. Such measurements of changes in for instance the shape of the patterning device could be used to determine the influence of thermal loads on the shape of the patterning device. The information obtained may be used for corrective actions in the lithographic apparatus.

In the lithographic embodiment of FIG. 1, the sensor is connected to the patterning device bending controller MBC so that the patterning device bending controller MBC can be provided with feedback information on the actual curvature of the patterning device MA on the patterning device support (e.g. mask table) MT. In this way a feedback control loop for the curvature of the patterning device MA is obtained.

Figure 2:
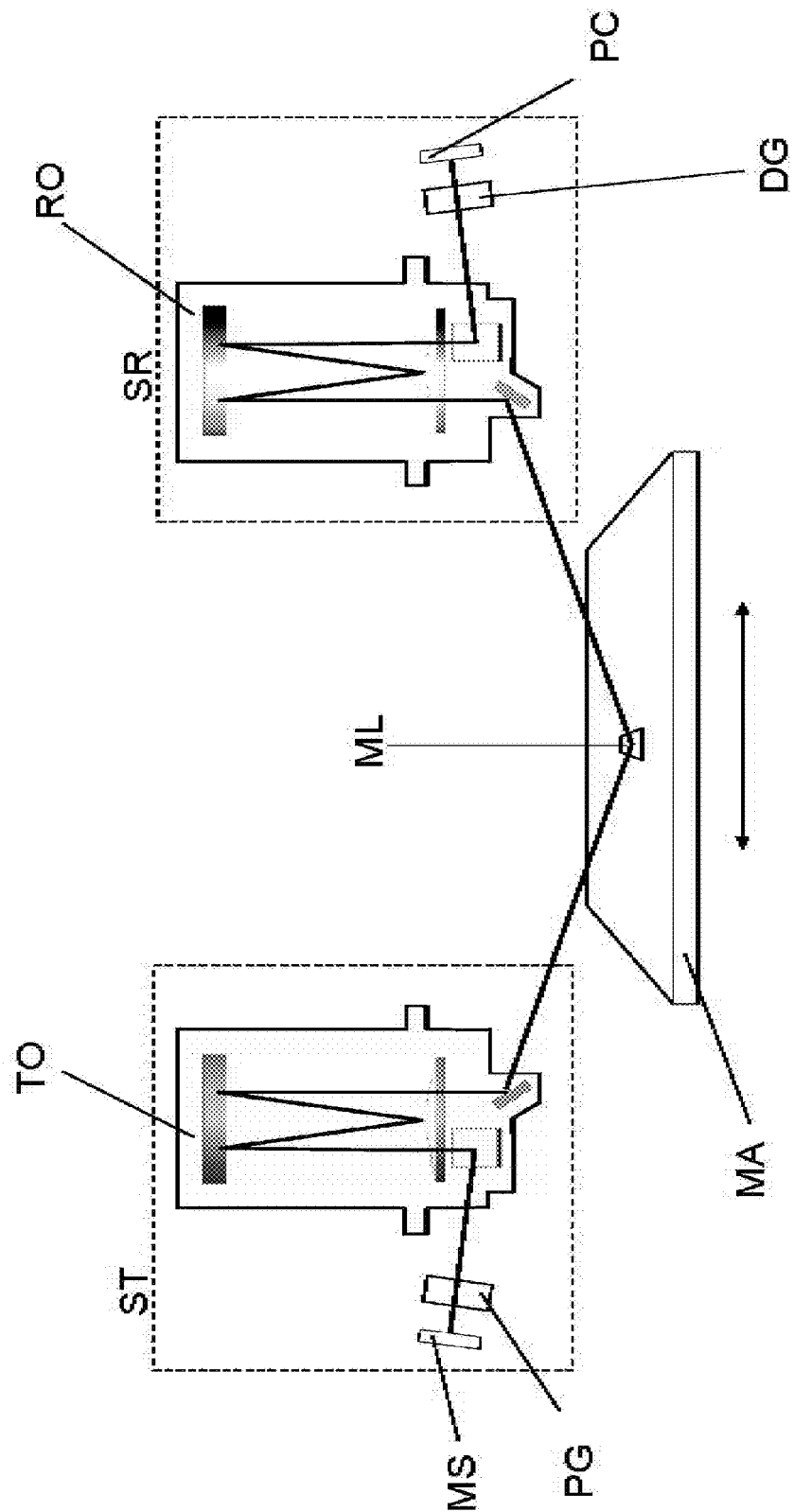
FIG. 2 depicts a cross section an embodiment of a sensor device according to an embodiment of the invention.

In FIG. 2 a cross section of the sensor to measure a height level of a patterning device MA at a measurement location ML is shown in more detail. The sensor transmitter ST and sensor receiver SR are indicated by dashed lines. The sensor transmitter ST includes a beam source MS which provides a measurement beam. Via a projection grating PG and transmitter optics TO the measurement beam is directed towards a measurement location ML on the patterning device MA. The measurement beam is reflected by the surface of the patterning device MA and received by the receiver optics RO and goes through a detection grating DG. Then the measurement beam is received on a detector, e.g. photocell PC which determines on the basis of the difference between the projected image of the projection grating PG and the detection grating DG a height level of the surface of the patterning device MA at the measurement location. The angle of the measurement beam with respect to the surface of the patterning device MA is chosen such that the radiation beam of the lithographic apparatus is not disturbed by the measurement beam of the sensor device.

Figure 3:
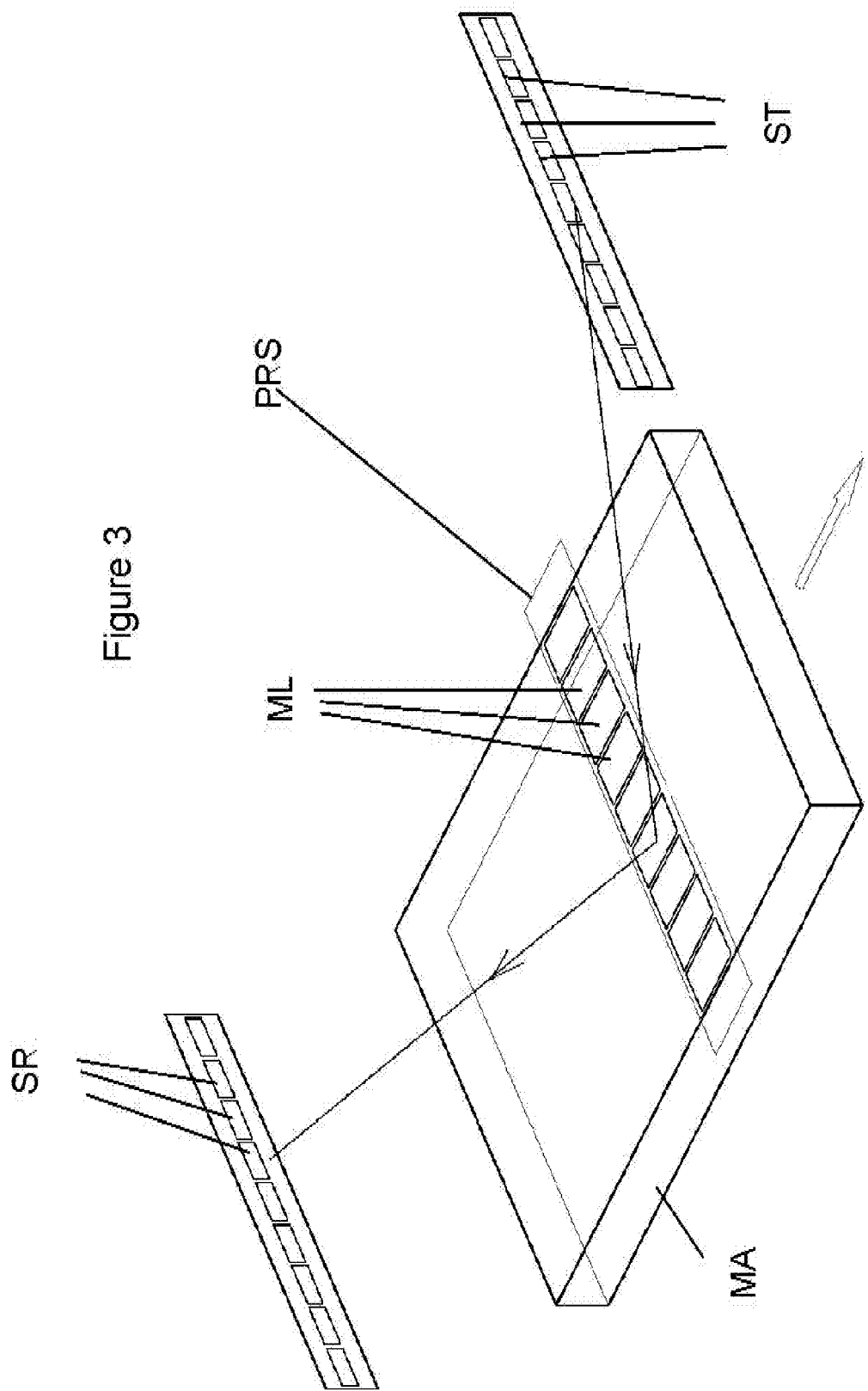
FIG. 3 depicts an embodiment of a sensor device according to an embodiment of the invention.

With reference to FIG. 3 it will be explained how the curvature of a patterning device MA may be determined. In this embodiment, it is desired to determine the curvature of the patterning device substantially perpendicular to the scanning direction (indicated by a double-lined arrow) and at the projection slit PRS, i.e. the projection area. Nine measurement locations ML are arranged at a line substantially perpendicular to the scanning direction, and in the projection slit PRS.

For each measurement location ML a sensor transmitter-receiver pair is provided. The sensor transmitters ST are arranged in an array of transmitters and the sensor receivers SR are arranged in an array of receivers. At each of the measurement locations ML, the height level of the surface of the patterning device is measured.

As the height levels of the patterning device MA along the measurement locations ML are determined, the curvature of the patterning device MA along these measurement locations ML may be determined by comparing the difference between the measured heights of the at the different measurement locations ML.

The number of measurement locations ML is chosen such that the desired curvature of the patterning device MA may be determined. In the embodiment of FIG. 3, the measurement locations ML are located in the projection slit PRS. It is remarked that the angle of the measurement beam with respect to the main surface of the patterning device has been chosen such that the measurement beam does not have any influence on the projection beam.

In an alternative embodiment, the measurement locations ML may be located next to the projection slit PRS.

In an embodiment measurement locations ML may be provided in two substantially perpendicular directions on the surface of a patterning device MA so that the curvature in two directions may be determined, for instance a saddle shape.

In an embodiment there is provided a lithographic apparatus including an illumination system, a support and a substrate table. The illumination system is configured to condition a radiation beam. The support is constructed to support a patterning device which is capable of imparting the radiation beam with a pattern in its cross-section to form a patterned radiation beam. The substrate table is constructed to hold a substrate. The lithographic apparatus further includes a projection system and a sensor. The projection system is configured to project the patterned radiation beam onto a target portion of the substrate. The sensor is configured to measure a height level, or a curvature, or an angle, or any combination of the foregoing, of a surface of the patterning device supported on the support.

The sensor may be configured to measure the height level, or the curvature, or the angle, or any combination of the foregoing, of the surface of the patterning device during projection of the patterned radiation beam.

The sensor may be configured to measure a height level of the patterning device at a plurality of measurement locations. The measurement locations may be located in a direction or on a line along which a curvature of the patterning device is to be determined.

The sensor may include a plurality of pairs of transmitter and receiver. Each pair may be configured to measure a height level of the patterning device at one of the plurality of measurement locations.

Each transmitter may be configured to transmit a measurement beam towards one of the plurality of measurement locations. Each receiver may include a detector to compare a reflected measurement beam with a reference to determine the height level.

Each transmitter may include a projection grating. An image of the projection grating may be projected on one of the plurality of measurement locations. Each receiver may include a detection grating and may be configured to compare a reflected projected image of the projection grating with the detection grating to determine the height level of the one of the plurality of measurement locations.

The plurality of measurement locations may be located close to or in an area on the patterning device where the radiation beam hits the patterning device.

The sensor may be configured to determine a curvature of the patterning device in a direction substantially perpendicular to a scanning direction of the lithographic apparatus.

The lithographic apparatus may further include a patterning device bender configured to bend the patterning device, and a controller. The controller may be configured to control the patterning device bender on the basis of a difference between a curvature measured by the sensor and a desired curvature of the patterning device.

The controller may include a subtractor to calculate the difference between the measured curvature and the desired curvature of the patterning device.

The sensor may be configured to determine a height map of the surface of the patterning device.

In an embodiment there is provided a method for compensating substrate unflatness in a lithographic process. The lithographic process may include forming a patterned radiation beam using a patterning device which is configured to impart a radiation beam with a pattern in its cross-section. The method further includes projecting the patterned beam of radiation onto the substrate. The method further includes measuring the substrate unflatness and determining a desired curvature for the patterning device to compensate for the substrate unflatness. The method further includes measuring a curvature of the patterning device, comparing the measured curvature and the desired curvature, and controlling a patterning device bender configured to bend the patterning device based on the comparing to compensate the substrate unflatness.

In an embodiment there is provided a method for determining the effect of patterning device unflatness in a lithographic process. The lithographic process may include forming a patterned radiation beam using a patterning device which is configured to impart a radiation beam with a pattern in its cross-section, and projecting the patterned beam of radiation onto the substrate. The method may further include measuring a patterning device unflatness during the lithographic process, determining an imaging error in the lithographic process, and analyzing a relationship between the imaging error and the patterning device unflatness. The imaging error may be a focal error.

In an embodiment there is provided a method for determining the effect of thermal loads on a patterning device during a lithographic process. The lithographic process may include forming a patterned radiation beam using a patterning device which is configured to impart a radiation beam with a pattern in its cross-section, and projecting the patterned beam of radiation onto the substrate. The method may further include measuring a patterning device unflatness during the lithographic process, and determining a change of the patterning device unflatness in the course of time.

The change in the patterning device unflatness may be used as input for corrective actions.

In an embodiment there is provided a lithographic apparatus including an illumination system, a support, a substrate table and a projection system. The illumination system is configured to condition a radiation beam. The support is constructed to support a patterning device which is capable of imparting the radiation beam with a pattern in its cross-section to form a patterned radiation beam. The substrate table is constructed to hold a substrate. The projection system is configured to project the patterned radiation beam onto a target portion of the substrate. The lithographic apparatus further includes a sensor and a bender. The sensor is configured to measure a surface characteristic of the patterning device supported on the support. The bender is configured to bend the patterning device based on the surface characteristic measured by the sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate; and
    a sensor configured to measure a height level, or a curvature, or an angle, or any combination of the foregoing, of a surface of the patterning device supported on the support,
    wherein the sensor is configured to determine a curvature of the patterning device in a direction substantially perpendicular to a scanning direction of the lithographic apparatus.

2. The lithographic apparatus of claim 1, wherein the sensor is configured to measure the height level, or the curvature, or the angle, or any combination of the foregoing, of the surface of the patterning device during projection of the patterned radiation beam.

3. The lithographic apparatus of claim 1, wherein the sensor is configured to measure a height level of the patterning device at a plurality of measurement locations, the measurement locations being located in a direction or on a line along which a curvature of the patterning device is to be determined.

4. The lithographic apparatus of claim 3, wherein the sensor comprises a plurality of pairs of transmitter and receiver, each pair being configured to measure a height level of the patterning device at one of the plurality of measurement locations.

5. The lithographic apparatus of claim 3, wherein each transmitter is configured to transmit a measurement beam towards one of the plurality of measurement locations, and wherein each receiver comprises a detector to compare a reflected measurement beam with a reference to determine the height level.

6. The lithographic apparatus of claim 4, wherein each transmitter comprises a projection grating, an image of which being projected on one of the plurality of measurement locations, and each receiver comprises a detection grating, wherein the receiver is configured to compare a reflected projected image of the projection grating with the detection grating to determine the height level of the one of the plurality of measurement locations.

7. The lithographic apparatus of claim 3, wherein the plurality of measurement locations are located close to or in an area on the patterning device where the radiation beam hits the patterning device.

8. The lithographic apparatus of claim 1, wherein the lithographic apparatus comprises:
    a patterning device bender configured to bend the patterning device, and
    a controller configured to control the patterning device bender on the basis of a difference between a curvature measured by the sensor and a desired curvature of the patterning device.

9. The lithographic apparatus of claim 8, wherein the controller comprises a subtractor to calculate the difference between the measured curvature and the desired curvature of the patterning device.

10. The lithographic apparatus of claim 1, wherein the sensor is configured to determine a height map of the surface of the patterning device.

11. A method for compensating substrate unflatness in a lithographic process, the lithographic process including forming a patterned radiation beam using a patterning device which is configured to impart a radiation beam with a pattern in its cross-section, and projecting the patterned beam of radiation onto the substrate, the method comprising:
    measuring the substrate unflatness;
    determining a desired curvature for the patterning device to compensate for the substrate unflatness;
    measuring a curvature of the patterning device;
    comparing the measured curvature and the desired curvature; and
    controlling a patterning device bender configured to bend the patterning device based on the comparing to compensate the substrate unflatness.

12. A method for determining the effect of patterning device unflatness in a lithographic process, the lithographic process including forming a patterned radiation beam using a patterning device which is configured to impart a radiation beam with a pattern in its cross-section, and projecting the patterned beam of radiation onto the substrate, the method comprising:
    measuring a patterning device unflatness during the lithographic process;
    determining an imaging error in the lithographic process; and
    analyzing a relationship between the imaging error and the patterning device unflatness.

13. The method of claim 12, wherein the imaging error is a focal error.

14. A method comprising:
    determining the effect of thermal loads on a patterning device during a lithographic process, the determining including measuring a patterning device unflatness during the lithographic process, the lithographic process including forming a patterned radiation beam using the patterning device which is configured to impart a radiation beam with a pattern in its cross-section, and projecting the patterned beam of radiation onto the substrate; and determining a change of the patterning device unflatness in the course of time.

15. The method of claim 14, wherein the change in the patterning device unflatness is used as input for corrective actions.

* * * * *